(12) United States Patent
Choong (10) Patent No.: US 11,133,220 B2
(45) Date of Patent: Sep. 28, 2021

(54) MANUFACTURING METHOD OF PACKAGES

(71) Applicant: DISCO CORPORATION, Tokyo (JP)

(72) Inventor: Wai Kit Choong, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/991,418

(22) Filed: Aug. 12, 2020

(65) Prior Publication Data

US 2021/0050265 A1 Feb. 18, 2021

(30) Foreign Application Priority Data

Aug. 13, 2019 (JP) .............................. JP2019-148594

(51) Int. Cl.
*H01L 21/78* (2006.01)
*H01L 21/56* (2006.01)
*H01L 21/304* (2006.01)

(52) U.S. Cl.
CPC .......... *H01L 21/78* (2013.01); *H01L 21/3043* (2013.01); *H01L 21/56* (2013.01)

(58) Field of Classification Search
CPC ..... H01L 21/78; H01L 21/56; H01L 21/3043; H01L 2221/68327; H01L 21/6835; H01L 21/561; H01L 23/3114; H01L 21/304
See application file for complete search history.

(56) References Cited

U.S. PATENT DOCUMENTS

| 7,221,059 | B2 * | 5/2007 | Farnworth | .......... | H01L 21/3043 |
| | | | | | 257/778 |
| 2012/0228750 | A1 * | 9/2012 | Okumura | ................ | H01L 24/13 |
| | | | | | 257/659 |
| 2016/0276176 | A1 * | 9/2016 | Kamphuis | ........... | H01L 23/3164 |
| 2019/0096821 | A1 * | 3/2019 | Chiang | ............... | H01L 23/3171 |

FOREIGN PATENT DOCUMENTS

JP 2007019379 A 1/2007

* cited by examiner

*Primary Examiner* — Thanh T Nguyen
(74) *Attorney, Agent, or Firm* — Greer Burns & Crain Ltd.

(57) ABSTRACT

A method of manufacturing packages includes forming grooves with a depth that reaches a finished thickness of a device chip along planned dividing lines from a front surface of a device wafer, sealing the front surface of the device wafer by a sealant and filling the grooves with the sealant, and grinding a back surface of the device wafer corresponding to a device region to form a recessed part with a depth that reaches the grooves and forms an annular projection part that surrounds the recessed part and corresponds to a peripheral surplus region. The recessed part is filled with the sealant to execute sealing and dividing grooves are formed with a smaller width than the grooves along the grooves from the front surface of the device wafer. The device wafer is divided to form plural packages in each of which the device chip is sealed by the sealant.

3 Claims, 11 Drawing Sheets

MANUFACTURING METHOD OF PACKAGES

BACKGROUND OF THE INVENTION

Field of the Invention

The present invention relates to a manufacturing method of packages in each of which a device chip is sealed by a sealant.

Description of the Related Art

For example, in the case of depositing a metal film that functions as a heat sink on a back surface of a device chip, a processing method is used in which only the back surface corresponding to a device region in a device wafer is ground to thin part of the wafer and the peripheral part is left with the original thickness in order to make handling in the film deposition step easy (for example, refer to Japanese Patent Laid-Open 2007-19379).

SUMMARY OF THE INVENTION

Device chips manufactured by the processing method described in Japanese Patent Laid-Open 2007-19379 are each mounted on a mounting board. A sealing substrate on which plural device chips are mounted through sealing of the device chips and so forth is formed. Then, packages including the device chip are manufactured by dividing the sealing substrate.

In the processing method described in Japanese Patent Laid-Open 2007-19379, the device wafer in which a recessed part is formed at the center and a peripheral projection part is formed involves a possibility of breakage when the peripheral projection part is removed because only the thinned central part is left. Thus, an improvement is desired.

Thus, an object of the present invention is to provide a manufacturing method of packages that can reduce the possibility of breakage of a device wafer.

In accordance with an aspect of the present invention, there is provided a manufacturing method of packages in each of which a device chip is sealed by a sealant. The manufacturing method of packages includes a device wafer preparation step of preparing a device wafer having a front surface including a device region in which a device is formed in each of regions marked out by a plurality of planned dividing lines that intersect and a peripheral surplus region that surrounds the device region, a groove forming step of forming grooves with a depth that reaches a finished thickness of the device chip along the planned dividing lines from the front surface of the device wafer, and a front surface sealing step of sealing the front surface of the device wafer by the sealant and filling the grooves with the sealant after executing the groove forming step. The manufacturing method of packages further includes a back surface grinding step of grinding a back surface of the device wafer corresponding to the device region to form a recessed part with a depth that reaches the grooves and form an annular projection part that surrounds the recessed part and corresponds to the peripheral surplus region after executing the front surface sealing step, a back surface sealing step of filling the recessed part with the sealant to execute sealing after executing the back surface grinding step, and a dividing step of forming dividing grooves with a smaller width than the grooves along the grooves from the front surface of the device wafer and dividing the device wafer to form a plurality of packages in each of which the device chip is sealed by the sealant after executing the back surface sealing step.

Preferably, the device has a protrusion electrode and the front surface is sealed by the sealant in such a manner that the protrusion electrode is covered in the front surface sealing step. Furthermore, the manufacturing method of packages further includes a front surface planarization step of planarizing the sealant on the front surface of the device wafer and exposing an end part of the protrusion electrode after executing the front surface sealing step and before executing the back surface grinding step.

Preferably, the manufacturing method of packages further includes a planarization step of planarizing the sealant on the back surface of the device wafer after executing the back surface sealing step and before executing the dividing step.

The manufacturing method of packages according to the present invention provides an effect that the possibility of breakage of the device wafer can be reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, in constituent elements described below, what can be easily envisaged by those skilled in the art and what are substantially the same are included. Moreover, configurations described below can be combined as appropriate. In addition, various kinds of omission, replacement, or change of configurations can be executed without departing from the gist of the present invention.

Figure 1:
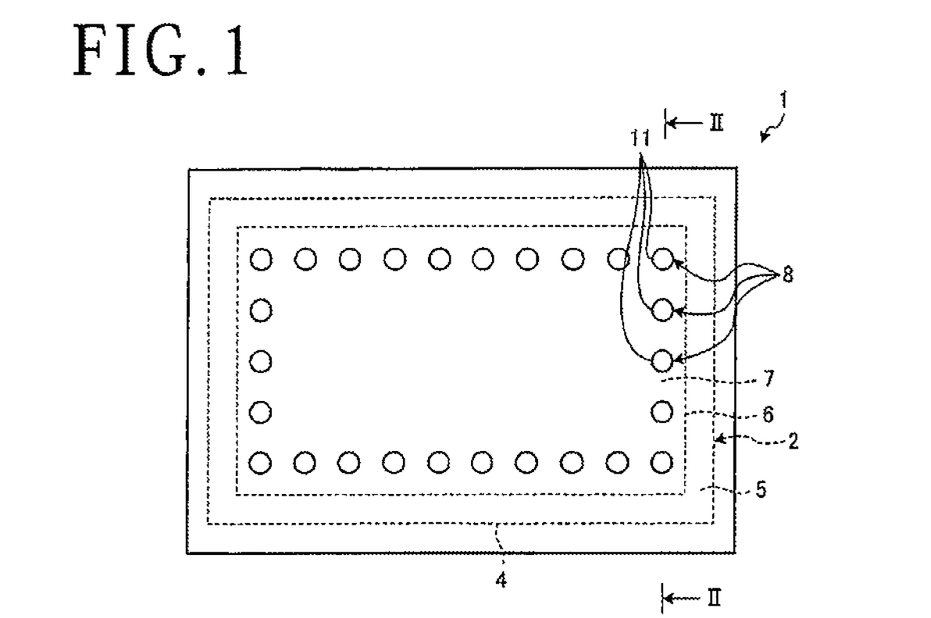
FIG. 1 is a plan view illustrating one example of a package manufactured by a manufacturing method of packages according to an embodiment.
Figure 2:
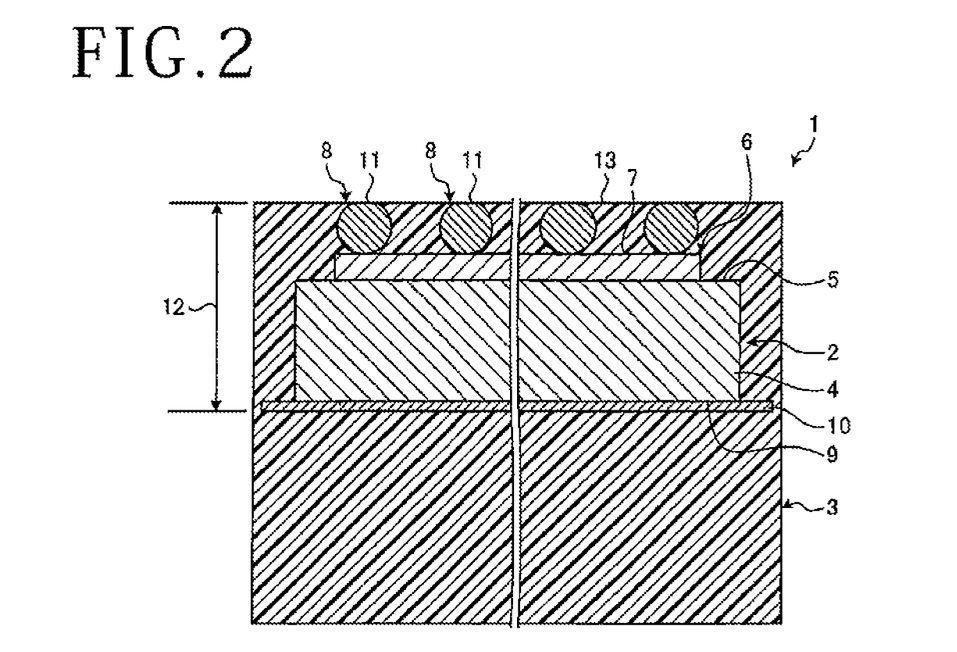
FIG. 2 is a sectional view along line II-II in FIG. 1.
Figure 3:
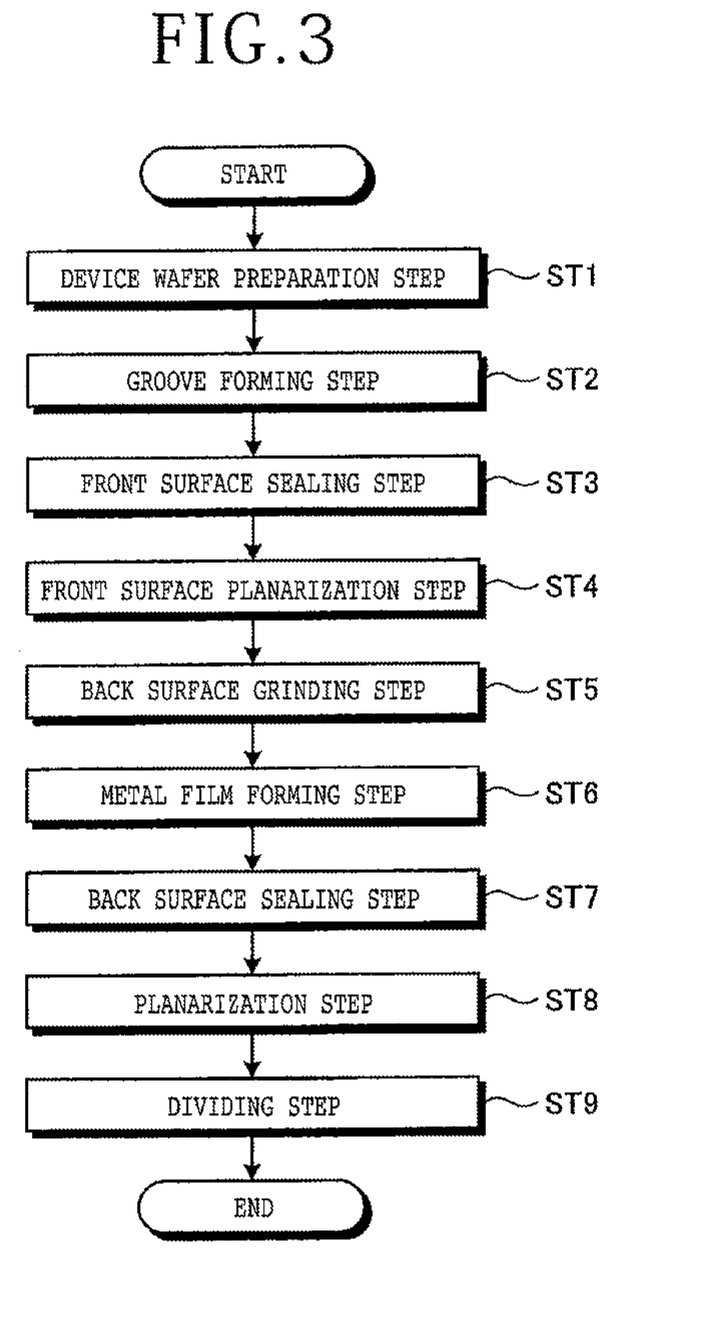
FIG. 3 is a flowchart illustrating a flow of the manufacturing method of packages according to the embodiment.

A manufacturing method of packages according to the embodiment of the present invention will be described based on the drawings. FIG. 1 is a plan view illustrating one example of a package manufactured by the manufacturing method of packages according to the embodiment. FIG. 2 is a sectional view along line II-II in FIG. 1. FIG. 3 is a flowchart illustrating a flow of the manufacturing method of packages according to the embodiment.

The manufacturing method of packages according to the embodiment is a method for manufacturing a package 1 illustrated in FIG. 1 and FIG. 2. The package 1 manufactured by the manufacturing method of packages according to the embodiment includes a device chip 2 and a sealant 3 as illustrated in FIG. 1 and FIG. 2. As illustrated in FIG. 1, the device chip 2 includes a substrate 4 and a device 6 formed on a front surface 5 of the substrate 4. In the embodiment, the device 6 is a circuit such as an integrated circuit (IC) or large scale integration (LSI).

Furthermore, as illustrated in FIG. 2, the device 6 has, on a front surface 7, plural bumps 8 that are protrusion electrodes for connecting to a substrate or the like that is not illustrated in the diagram. The bumps 8 are composed of an electrically-conductive metal. The bumps 8 protrude from the front surface 7 of the device 6 and are formed into a spherical shape in the embodiment.

As illustrated in FIG. 2, a metal film 10 is formed on a back surface 9 on a back side of the front surface 5 of the substrate 4 of the device chip 2. In the embodiment, the metal film 10 is composed of a metal having electrical conductivity and functions as a heat sink of the package 1.

The sealant 3 is composed of a synthetic resin having insulation properties. The sealant 3 covers the front surface 7 of the device 6 of the device chip 2, the side surfaces of the device chip 2, and the metal film 10 and seals the front surface 7 of the device 6, i.e., the front surface of the device chip 2, and the side surfaces and the back surface 9 of the device chip 2. Furthermore, the sealant 3 exposes tips 11 that are end parts of the bumps 8 and are separate from the front surface 7 of the device 6. In the embodiment, the sealant 3 seals all side surfaces. That is, the device chip 2 is sealed by the sealant 3. Furthermore, in the embodiment, the sealant 3 is composed of a heat-curable resin.

As illustrated in FIG. 3, the manufacturing method of packages according to the embodiment includes a device wafer preparation step ST1, a groove forming step ST2, a front surface sealing step ST3, a front surface planarization step ST4, a back surface grinding step S5, a metal film forming step ST6, a back surface sealing step ST7, a planarization step ST8, and a dividing step ST9.

(Device Wafer Preparation Step)

Figure 4:
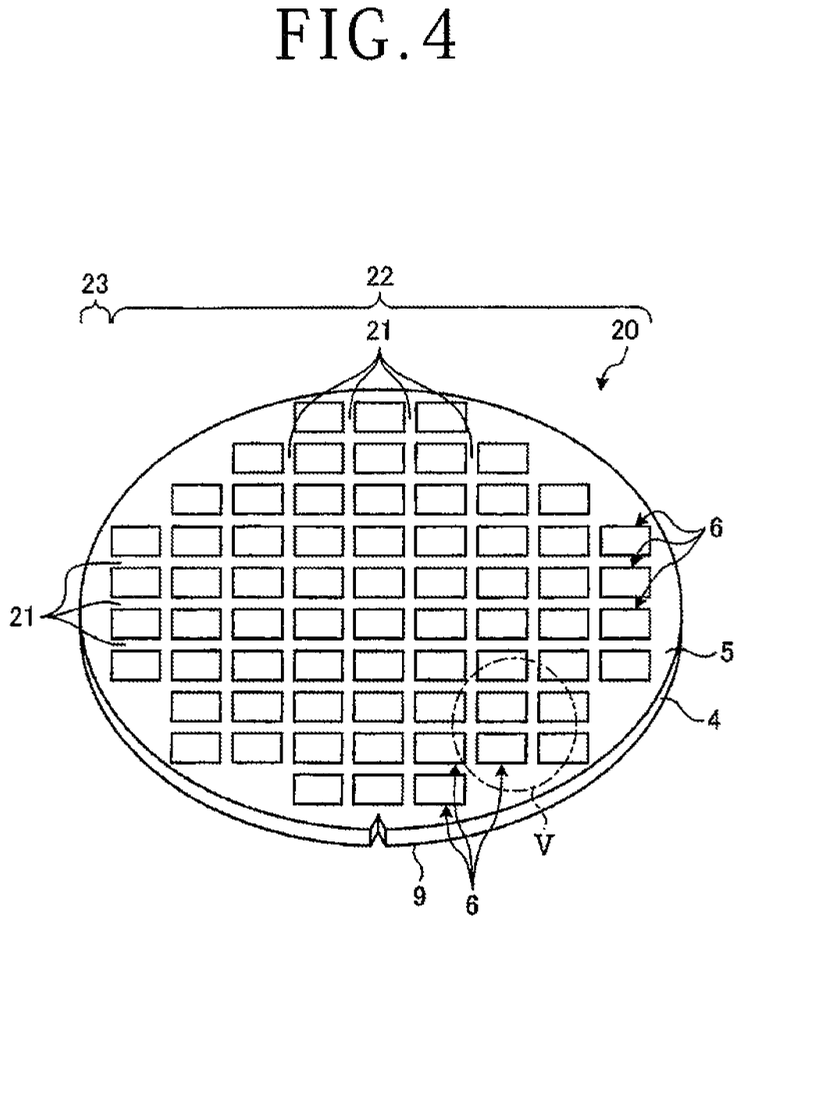
FIG. 4 is a perspective view of a wafer prepared in a device wafer preparation step of the manufacturing method of packages illustrated in FIG. 3.
Figure 5:
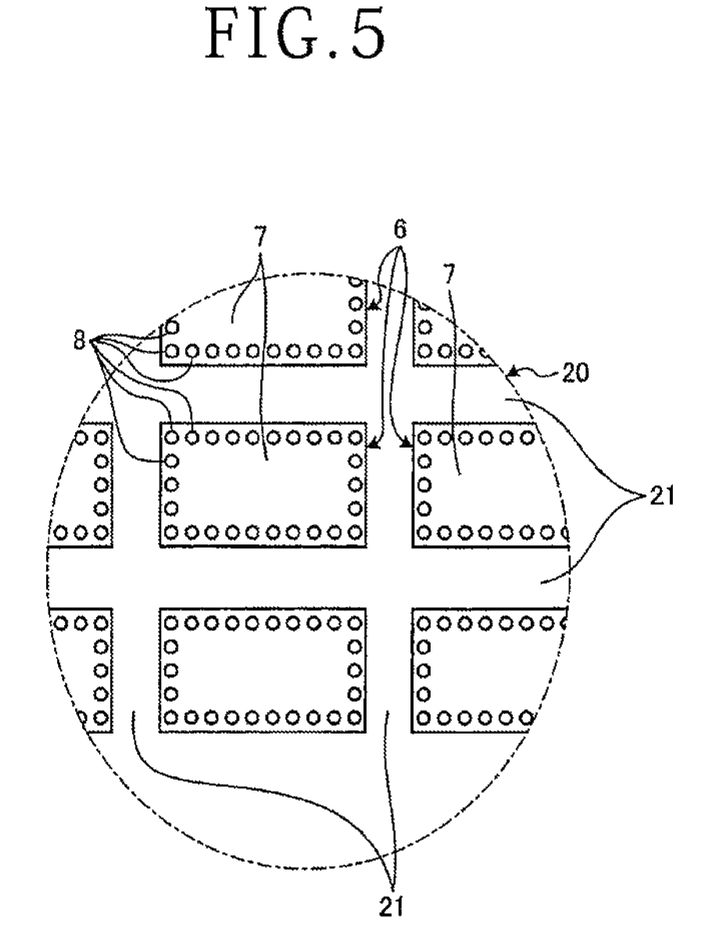
FIG. 5 is an enlarged plan view illustrating part V in FIG. 4.

FIG. 4 is a perspective view of a wafer prepared in the device wafer preparation step of the manufacturing method of packages illustrated in FIG. 3. FIG. 5 is an enlarged plan view illustrating part V in FIG. 4. The device wafer preparation step ST1 is a step of preparing a device wafer 20 illustrated in FIG. 4.

The device wafer 20 is a circular-disc-shaped semiconductor wafer or the like that includes silicon, sapphire, gallium arsenide, or the like as the substrate 4. In explanation of the device wafer 20, a description will be made in such a manner that a part in common with the device chip 2 is given the same numeral. As illustrated in FIG. 4, the device wafer 20 has the front surface 5 including a device region 22 in which the device 6 is formed in each of regions marked out by plural planned dividing lines 21 that intersect and a peripheral surplus region 23 that surrounds the device region 22. The peripheral surplus region 23 is a region in which the device 6 is not formed. As illustrated in FIG. 5, the planar shape of the devices 6 is formed into a rectangular shape and plural bumps 8 are disposed on the front surface 7. When the device wafer 20 has been prepared, the manufacturing method proceeds to the groove forming step ST2.

(Groove Forming Step)

Figure 6:
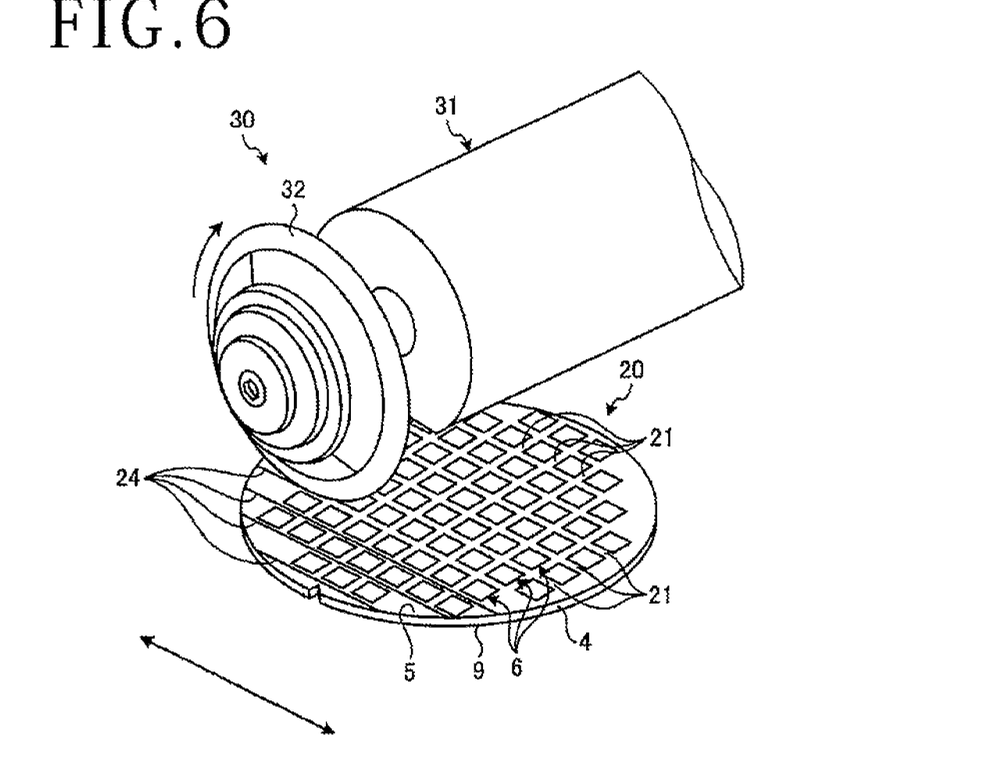
FIG. 6 is a perspective view schematically illustrating a groove forming step of the manufacturing method of packages illustrated in FIG. 3.

FIG. 6 is a perspective view schematically illustrating the groove forming step of the manufacturing method of packages illustrated in FIG. 3. The groove forming step ST2 is a step of forming grooves 24 with a depth 24-1 that reaches a finished thickness 12 (illustrated in FIG. 2) of the device chip 2 along the planned dividing lines 21 from the side of the front surface 5 of the substrate 4 of the device wafer 20. The finished thickness 12 of the device chip 2 is the thickness of the device chip 2 from the tips 11 of the bumps 8 to the metal film 10.

In the embodiment, in the groove forming step ST2, the side of the back surface 9 of the device wafer 20 is placed on a holding surface of a chuck table that is not illustrated in the diagram in a cutting apparatus 30 illustrated in FIG. 6 and the cutting apparatus 30 sucks and holds the side of the back surface 9 of the device wafer 20 on the holding surface of the chuck table. In the groove forming step ST2, the cutting apparatus 30 images the front surface 5 of the device wafer 20 by imaging means that is not illustrated in the diagram and detects the planned dividing line 21 to fulfill alignment in which position adjustment between a cutting blade 32 of a cutting unit 31 and the planned dividing line 21 is executed.

In the groove forming step ST2, the cutting apparatus 30 makes the cutting blade 32 cut into the center of the planned dividing line 21 in the width direction from the side of the front surface 5 of the device wafer 20 to the depth 24-1 that reaches the finished thickness 12 from the tips 11 of the bumps 8 as illustrated in FIG. 6 while relatively moving the chuck table and the cutting blade 32 along the planned dividing line 21. In the groove forming step ST2, the cutting apparatus 30 forms the groove 24 in the planned dividing line 21 by the cutting blade 32. The groove 24 is what is generally called a half-cut groove formed from the front surface 5 of the substrate 4 of the device wafer 20 to the center of the substrate 4 in the thickness direction. When the grooves 24 have been formed in all planned dividing lines 21 as illustrated in FIG. 7 in the groove forming step ST2, the manufacturing method proceeds to the front surface sealing step ST3.

In the embodiment, the cutting blade 32 has a first thickness and the grooves 24 have a first width 24-2 (illustrated in FIG. 7) equivalent to the first thickness. Furthermore, in the embodiment, the depth 24-1 of the grooves 24 from the tips 11 of the bumps 8 to bottom surfaces is deeper than the finished thickness 12. In the embodiment, the grooves 24 are formed by cutting processing in which the cutting blade 32 is made to cut into the planned dividing line 21. However, in the present invention, the grooves 24 having the first width 24-2 may be formed by ablation processing in which the device wafer 20 is irradiated with a laser beam with such a wavelength as to be absorbed by the device wafer 20 along the planned dividing lines 21.

(Front Surface Sealing Step)

Figure 7:
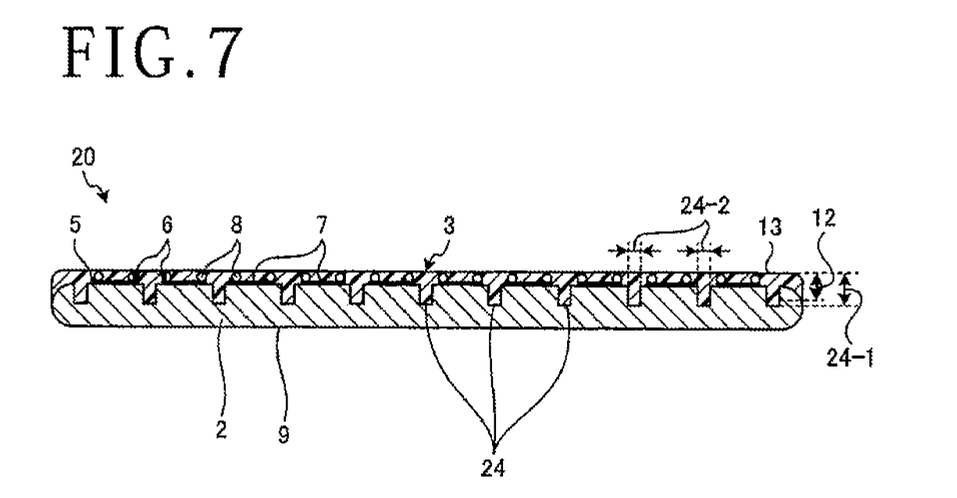
FIG. 7 is a sectional view of a device wafer after a front surface sealing step of the manufacturing method of packages illustrated in FIG. 3.

FIG. 7 is a sectional view of the device wafer after the front surface sealing step of the manufacturing method of packages illustrated in FIG. 3. The front surface sealing step ST3 is a step of sealing the side of the front surfaces 7 of the devices 6 of the device wafer 20 by the sealant 3 and filling the grooves 24 with the sealant 3 after executing the groove forming step ST2.

In the front surface sealing step ST3, a heat-curable resin that forms the sealant 3 is supplied to the side of the front surfaces 7 of the devices 6 of the device wafer 20 and the front surfaces 7 are covered by the heat-curable resin. In addition, the grooves 24 are filled with the heat-curable resin. In the front surface sealing step ST3, the heat-curable resin is heated to be cured to seal the front surfaces 5 and 7 by the sealant 3 and fill the grooves 24 with the sealant 3 as illustrated in FIG. 7. When the front surfaces 5 and 7 have been sealed by the sealant 3 and the grooves 24 have been filled with the sealant 3, the manufacturing method proceeds to the front surface planarization step ST4. In the embodiment, in the front surface sealing step ST3, the side of the front surfaces 7 of the devices 6 is sealed by the sealant 3 in such a manner that the whole of the bumps 8 is covered. However, in the present invention, the side of the front surfaces 7 of the devices 6 of the device wafer 20 may be sealed by the sealant 3 in such a manner that the state in which the tips 11 of the bumps 8 are exposed from a front surface 13 of the sealant 3 is obtained.

(Front Surface Planarization Step)

Figure 8:
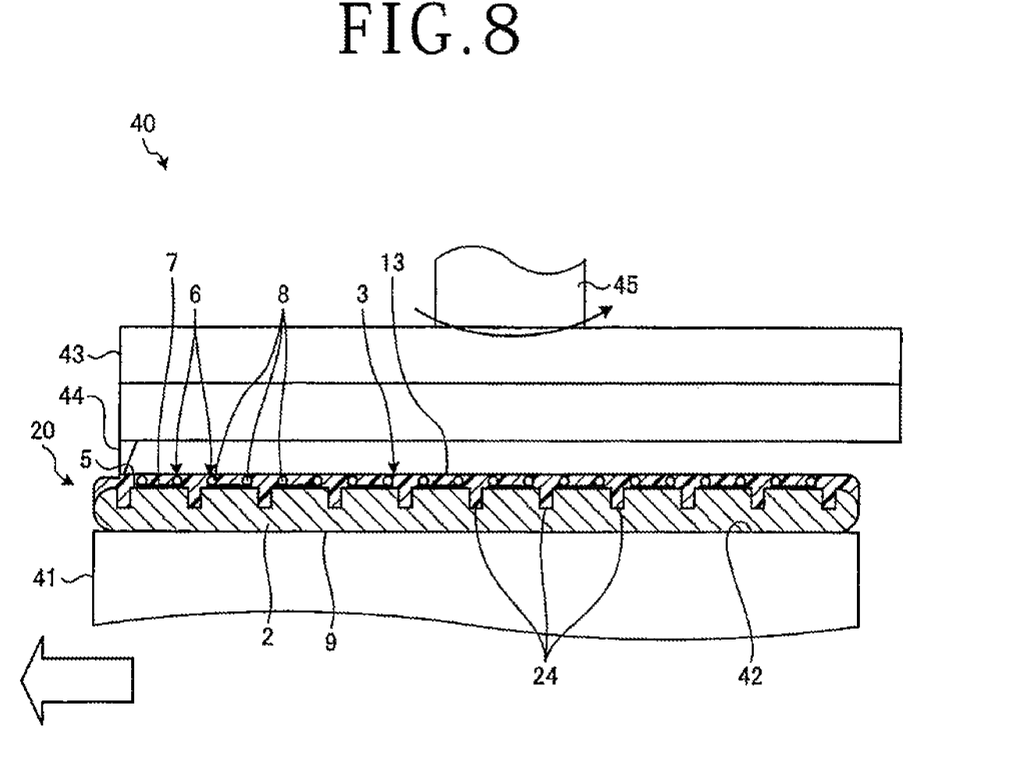
FIG. 8 is a partially sectional side view schematically illustrating a front surface planarization step of the manufacturing method of packages illustrated in FIG. 3.
Figure 9:
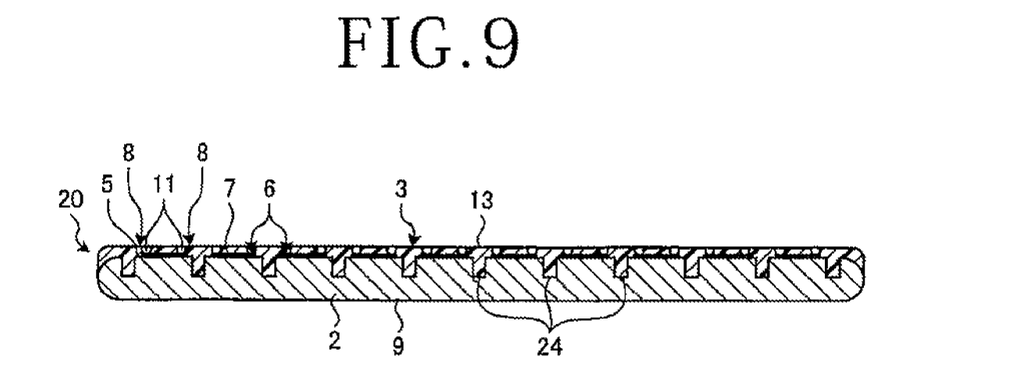
FIG. 9 is a sectional view of the device wafer after the front surface planarization step of the manufacturing method of packages illustrated in FIG. 3.

FIG. 8 is a partially sectional side view schematically illustrating the front surface planarization step of the manufacturing method of packages illustrated in FIG. 3. FIG. 9 is a sectional view of the device wafer after the front surface planarization step of the manufacturing method of packages illustrated in FIG. 3. The front surface planarization step ST4 is a step of planarizing the front surface 13 of the sealant 3 on the side of the front surfaces 7 of the devices 6 of the device wafer 20 and exposing the tips 11 of the bumps 8 after executing the front surface sealing step ST3 and before executing the back surface grinding step ST5.

In the embodiment, in the front surface planarization step ST4, a tool bit cutting apparatus 40 illustrated in FIG. 8 sucks and holds the side of the back surface 9 of the device wafer 20 on a holding surface 42 of a chuck table 41. In the front surface planarization step ST4, the tool bit cutting apparatus 40 positions a tip of a tool bit 44 of a tool bit wheel 43 to the front surface 13 of the sealant 3 at a height of the tips 11 of the bumps 8. In the front surface planarization step ST4, as illustrated in FIG. 8, the tool bit cutting apparatus 40 moves the chuck table 41 in the horizontal direction along an arrow in FIG. 8, for example, while rotating the tool bit wheel 43 around the axis center parallel to the vertical direction by a spindle 45, and makes the chuck table 41 pass below the tool bit wheel 43 to cut the whole of the front surface 13 of the sealant 3 by the tool bit 44 of the tool bit wheel 43.

In the front surface planarization step ST4, the tool bit cutting apparatus 40 cuts the sealant 3 that seals the front surfaces 7 of the devices 6 of the device wafer 20 in such a manner that the tips 11 of the bumps 8 are exposed from the front surface 13 of the sealant 3 as illustrated in FIG. 9. When the sealant 3 has been cut to expose the bumps 8 from the front surface 13 of the sealant 3 in the front surface planarization step ST4, the manufacturing method proceeds to the back surface grinding step ST5.

In the embodiment, in the front surface planarization step ST4, the front surface 13 of the sealant 3 is cut by the tool bit 44 of the tool bit cutting apparatus 40 and the tips 11 of the bumps 8 are exposed in the front surface 13 of the sealant 3. However, in the present invention, a grinding apparatus may cause grinding abrasive stones of a grinding wheel for grinding rotated by a spindle to abut against the front surface 13 of the sealant 3 while rotating a chuck table that holds the back surface side of the device wafer 20 around the axis center, and grind the front surface 13 of the sealant 3 to expose the tips 11 of the bumps 8 in the front surface 13 of the sealant 3. Furthermore, in the present invention, the front surface planarization step ST4 does not need to be executed if sealing with the sealant 3 is executed in the state in which the tips 11 of the bumps 8 are exposed from the front surface 13 in the front surface sealing step ST3.

(Back Surface Grinding Step)

Figure 10:
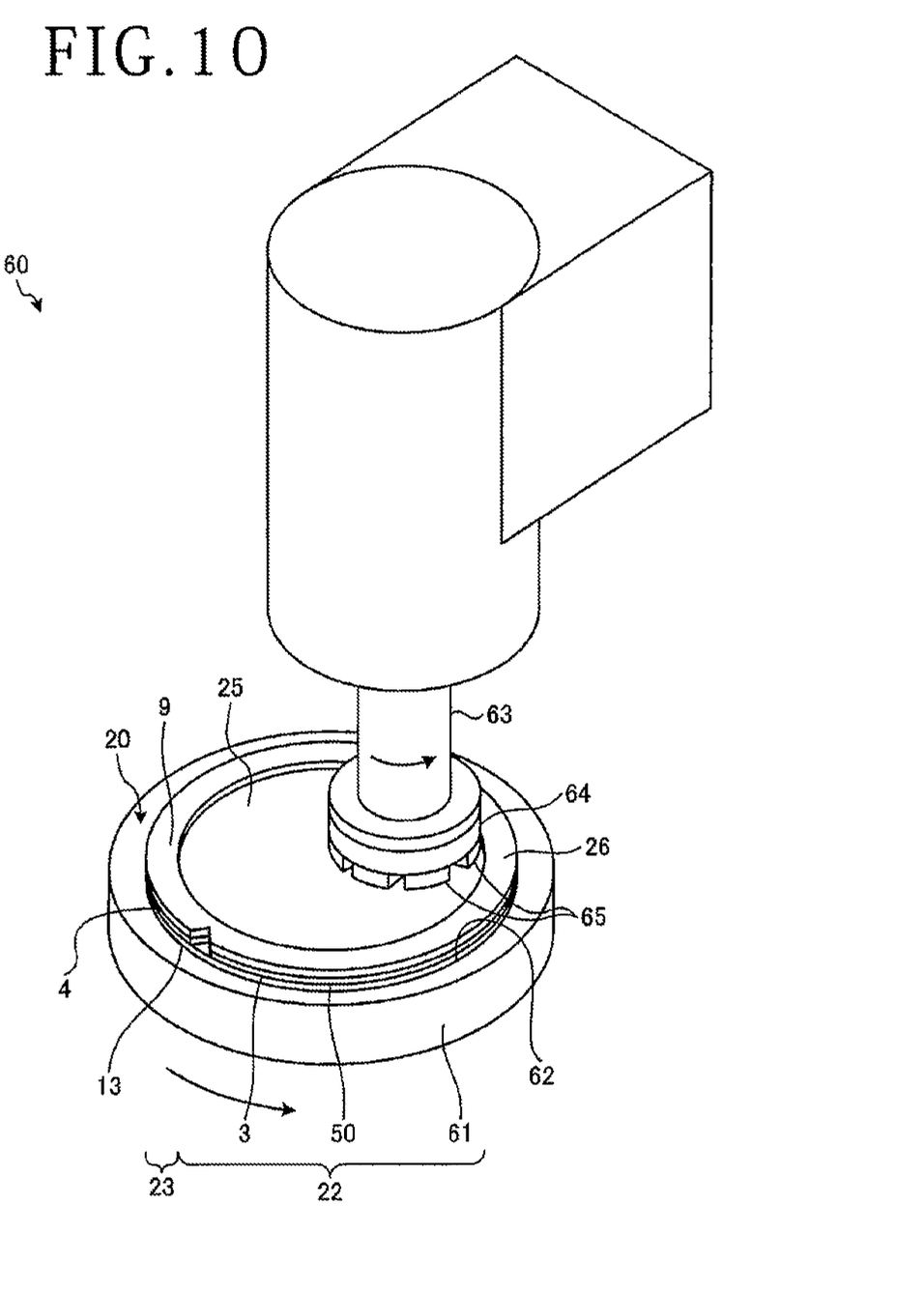
FIG. 10 is a perspective view schematically illustrating a back surface grinding step of the manufacturing method of packages illustrated in FIG. 3.
Figure 11:
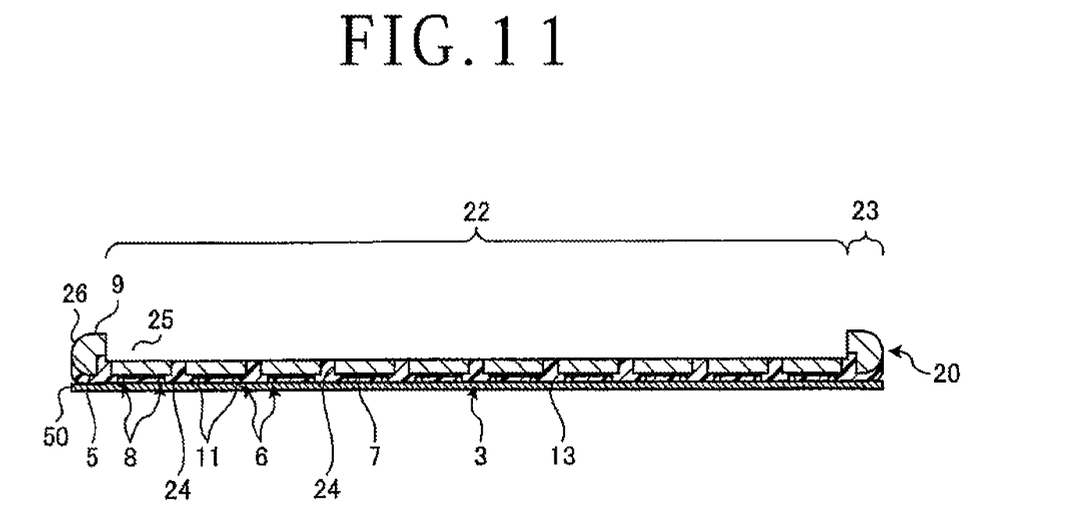
FIG. 11 is a sectional view of the device wafer after the back surface grinding step of the manufacturing method of packages illustrated in FIG. 3.

FIG. 10 is a perspective view schematically illustrating the back surface grinding step of the manufacturing method of packages illustrated in FIG. 3. FIG. 11 is a sectional view of the device wafer after the back surface grinding step of the manufacturing method of packages illustrated in FIG. 3. The back surface grinding step ST5 is a step of grinding the back surface 9 of the substrate 4 of the device wafer 20 corresponding to the device region 22 to form a recessed part 25 with a depth that reaches the grooves 24 and form an annular projection part 26 that surrounds the recessed part 25 and corresponds to the peripheral surplus region 23 after executing the front surface sealing step ST3.

In the back surface grinding step ST5, a protective tape 50 that is illustrated in FIG. 10 and is a circular-disc-shaped protective component with the same diameter as the device wafer 20 is stuck to the front surface 13 of the sealant 3 of the device wafer 20. In the embodiment, the protective tape 50 composed of a synthetic resin is stuck to the front surface 13 of the sealant 3 of the device wafer 20. However, in the present invention, the protective component is not limited to the protective tape 50 and may be a circular-disc-shaped component that is hard and has the same diameter as the device wafer 20.

In the back surface grinding step ST5, a grinding apparatus 60 illustrated in FIG. 10 sucks and holds the side of the front surface 13 of the sealant 3 of the device wafer 20 over a holding surface 62 of a chuck table 61 with the intermediary of the protective tape 50. In the back surface grinding step ST5, as illustrated in FIG. 10, the grinding apparatus 60 rotates a grinding wheel 64 by a spindle 63 around the axis center parallel to the vertical direction and rotates the chuck table 61 around the axis center parallel to the vertical direction. Furthermore, while supplying a grinding liquid from a grinding liquid nozzle that is not illustrated in the diagram, the grinding apparatus 60 causes grinding abrasive stones 65 of the grinding wheel 64 to abut against the part corresponding to the device region 22 in the back surface 9 and brings the grinding abrasive stones 65 closer to the chuck table 61 at a predetermined feed rate to grind the part corresponding to the device region 22 in the back surface 9 by the grinding abrasive stones 65.

In the back surface grinding step ST5, as illustrated in FIG. 10 and FIG. 11, the part corresponding to the device region 22 in the back surface 9 is ground by the grinding abrasive stones 65 to form the recessed part 25 that corresponds to the device region 22 and has a circular shape as the planar shape on the side of the back surface 9 of the substrate 4. In addition, the part corresponding to the peripheral surplus region 23 in the back surface 9 is not ground but kept at the thickness before the grinding to form the annular projection part 26 that corresponds to the peripheral surplus region 23 and has a ring shape as the planar shape on the side of the back surface 9 of the substrate 4. In the present invention, the part corresponding to the device region 22 in the back surface 9 of the substrate 4 of the device wafer 20 represents the part that overlaps with the device region 22 in the thickness direction of the device wafer 20 in the back surface 9 of the substrate 4 of the device wafer 20. In the present invention, the part corresponding to the peripheral surplus region 23 in the back surface 9 of the substrate 4 of the device wafer 20 represents the part that overlaps with the peripheral surplus region 23 in the thickness direction of the device wafer 20 in the back surface 9 of the substrate 4 of the device wafer 20.

In the back surface grinding step ST5, the part corresponding to the device region 22 in the back surface 9 of the substrate 4 of the device wafer 20 is ground until the thickness of the part under the recessed part 25 in the device wafer 20 becomes a predetermined thickness (in the embodiment, thickness obtained by subtracting the thickness of the metal film 10 from the finished thickness 12). After the part corresponding to the device region 22 in the back surface 9 of the substrate 4 of the device wafer 20 has been ground to the predetermined thickness, the manufacturing method proceeds to the metal film forming step ST6. In the device wafer 20 ground until the thickness of the part under the recessed part 25 in the device wafer 20 becomes the predetermined thickness in the back surface grinding step ST5, the sealant 3 with which the grooves 24 are filled is exposed on the side of the back surface 9 because the depth 24-1 of the grooves 24 is larger than the finished thickness 12.

(Metal Film Forming Step)

Figure 12:
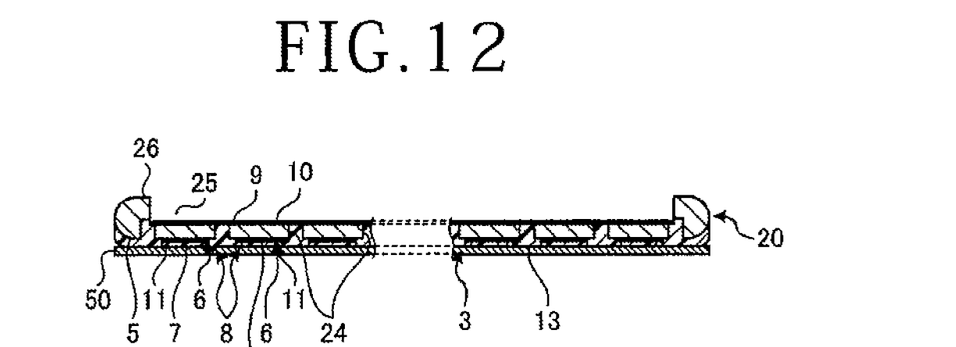
FIG. 12 is a sectional view of the device wafer after a metal film forming step of the manufacturing method of packages illustrated in FIG. 3.

FIG. 12 is a sectional view of the device wafer after the metal film forming step of the manufacturing method of packages illustrated in FIG. 3. The metal film forming step ST6 is a step of forming the metal film 10 on a bottom of the recessed part 25. In the embodiment, in the metal film forming step ST6, the metal film 10 with an even thickness is formed on the whole of the bottom of the recessed part 25 as illustrated in FIG. 12. Along with this, the manufacturing method proceeds to the back surface sealing step ST7.

(Back Surface Sealing Step)

Figure 13:
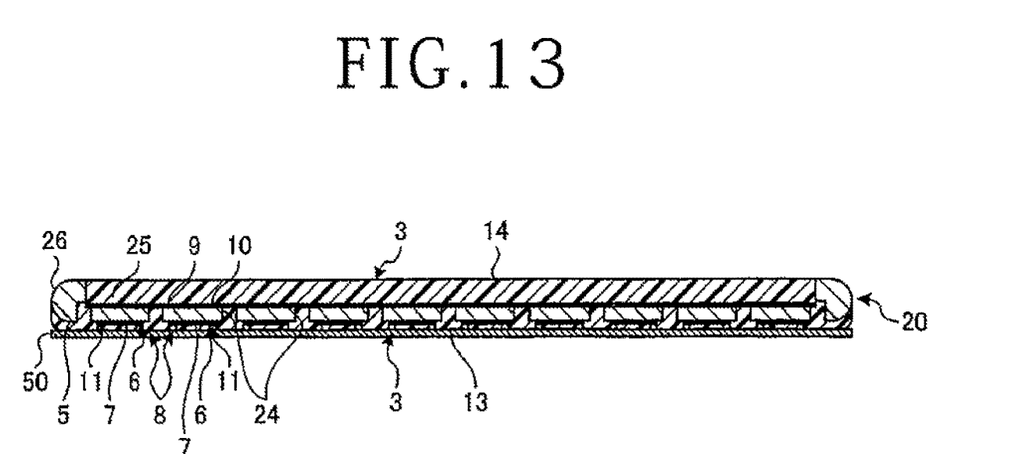
FIG. 13 is a sectional view of the device wafer after a back surface sealing step of the manufacturing method of packages illustrated in FIG. 3.

FIG. 13 is a sectional view of the device wafer after the back surface sealing step of the manufacturing method of packages illustrated in FIG. 3. The back surface sealing step ST7 is a step of filling the recessed part 25 with the sealant 3 to execute sealing after executing the back surface grinding step ST5.

In the back surface sealing step ST7, the heat-curable resin that forms the sealant 3 is supplied into the recessed part 25 formed in the back surface 9 of the device wafer 20 and the recessed part 25 is filled with the heat-curable resin. In the back surface sealing step ST7, the heat-curable resin is heated to be cured and the inside of the recessed part 25 is filled with the sealant 3 and is sealed as illustrated in FIG. 13. When the inside of the recessed part 25 has been sealed by the sealant 3, the manufacturing method proceeds to the planarization step ST8. In the embodiment, the heat-curable resin that seals the recessed part 25 in the back surface sealing step ST7 is the heat-curable resin that seals the side of the front surfaces 5 and 7 in the front surface sealing step ST3. However, in the present invention, the heat-curable resin is not limited thereto.

(Planarization Step)

Figure 14:
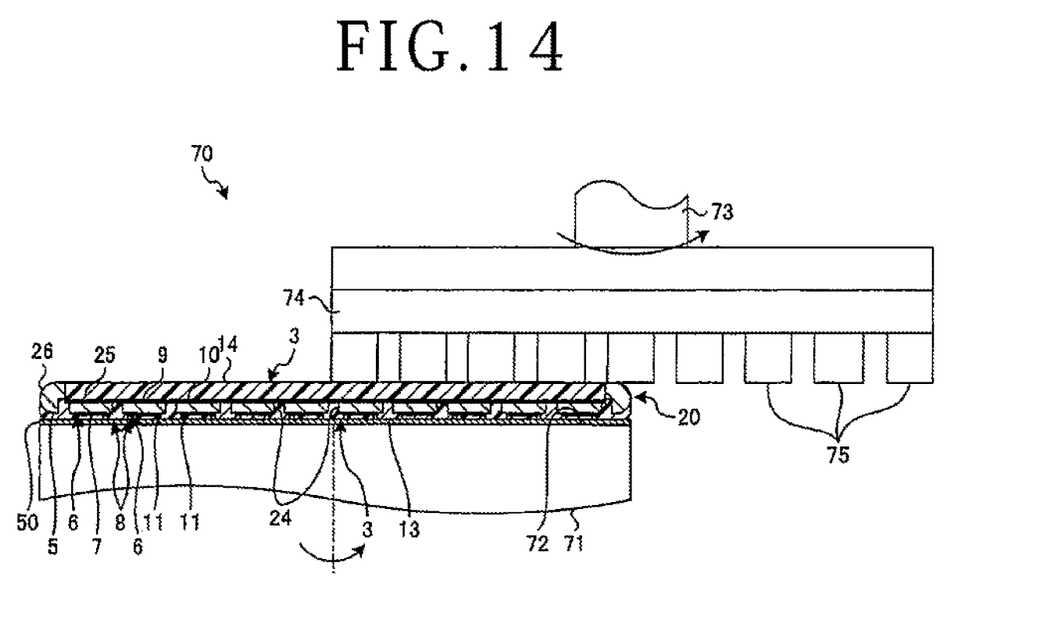
FIG. 14 is a partially sectional side view schematically illustrating a planarization step of the manufacturing method of packages illustrated in FIG. 3.

FIG. 14 is a partially sectional side view schematically illustrating the planarization step of the manufacturing method of packages illustrated in FIG. 3. The planarization step ST8 is a step of planarizing a surface 14 of the sealant 3 on the side of the back surface 9 of the substrate 4 of the device wafer 20 after executing the back surface sealing step ST7 and before executing the dividing step ST9.

In the embodiment, in the planarization step ST8, a grinding apparatus 70 illustrated in FIG. 14 sucks and holds the side of the front surface 13 of the sealant 3 of the device wafer 20 over a holding surface 72 of a chuck table 71 with the intermediary of the protective tape 50. In the planarization step ST8, as illustrated in FIG. 14, a grinding wheel 74 for grinding is rotated by a spindle 73 around the axis center parallel to the vertical direction and the chuck table 71 is rotated around the axis center parallel to the vertical direction. Furthermore, while a grinding liquid is supplied from a grinding liquid nozzle that is not illustrated in the diagram, grinding abrasive stones 75 of the grinding wheel 74 are made to abut against the surface 14 of the sealant 3 that seals the recessed part 25 and are brought closer to the chuck table 71 at a predetermined feed rate to grind the surface 14 of the sealant 3 by the grinding abrasive stones 75.

In the planarization step ST8, the surface 14 of the sealant 3 that seals the inside of the recessed part 25 of the device wafer 20 and the annular projection part 26 are ground to be planarized until the grinding wheel 74 gets closer to the chuck table 71 by a predetermined feed amount. In the embodiment, in the planarization step ST8, the grinding apparatus 70 executes the planarization until the surface 14 of the sealant 3 and the annular projection part 26 become flush with each other. When the grinding wheel 74 has gotten closer to the chuck table 71 by the predetermined feed amount, the manufacturing method proceeds to the dividing step ST9. In the embodiment, in the planarization step ST8, the surface 14 of the sealant 3 is ground to be planarized. However, in the present invention, the surface 14 may be cut by the tool bit 44 of the tool bit cutting apparatus 40 similarly to the front surface planarization step ST4. In the present invention, in the planarization step ST8, the grinding apparatus 70 may be used according to the sealant 3 or the tool bit cutting apparatus 40 may be used. For example, in the present invention, in the planarization step ST8, depending on the compound of the sealant 3, wear becomes large when the sealant 3 is ground by the grinding apparatus 70 and therefore it is desirable to cut the sealant 3 by the tool bit cutting apparatus 40.

(Dividing Step)

Figure 15:
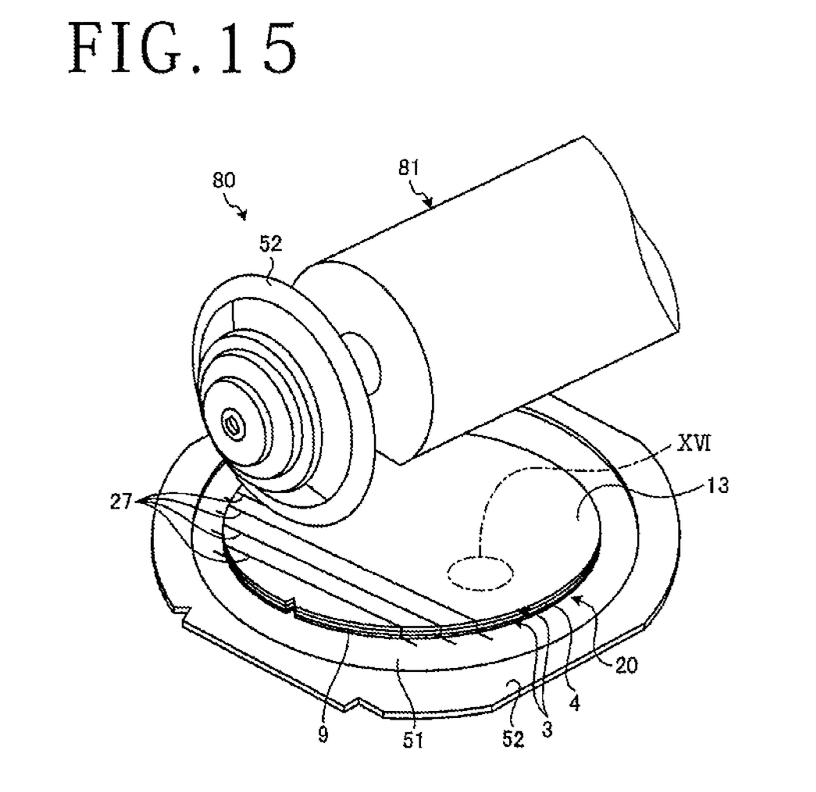
FIG. 15 is a perspective view schematically illustrating a dividing step of the manufacturing method of packages illustrated in FIG. 3.
Figure 16:
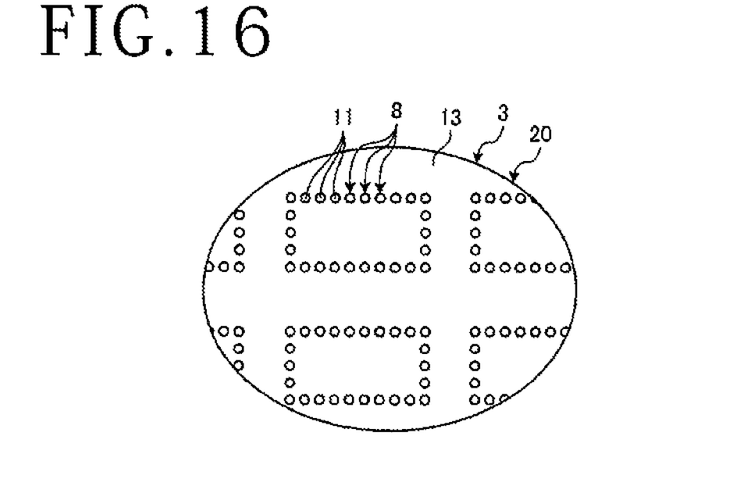
FIG. 16 is an enlarged plan view illustrating part XVI in FIG. 15.
Figure 17:
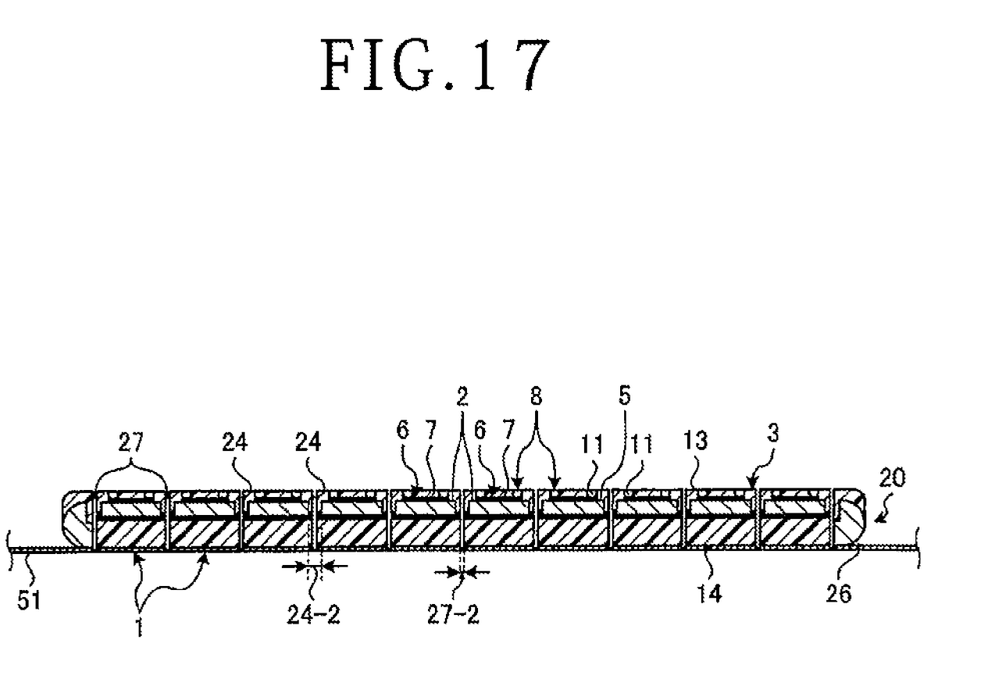
FIG. 17 is a sectional view of the device wafer after the dividing step of the manufacturing method of packages illustrated in FIG. 3.

FIG. 15 is a perspective view schematically illustrating the dividing step of the manufacturing method of packages illustrated in FIG. 3. FIG. 16 is an enlarged plan view illustrating part XVI in FIG. 15. FIG. 17 is a sectional view of the device wafer after the dividing step of the manufacturing method of packages illustrated in FIG. 3. The dividing step ST9 is a step of forming dividing grooves 27 with a smaller width 27-2 than the grooves 24 along the grooves 24 from the front surface 13 of the sealant 3 of the device wafer 20 and dividing the device wafer 20 to form plural packages 1 after executing the back surface sealing step ST7.

In the embodiment, in the dividing step ST9, the protective tape 50 is separated from the side of the front surface 13 of the sealant 3 of the device wafer 20. In the embodiment, in the dividing step ST9, a dicing tape 51 that is illustrated in FIG. 15 and has a circular disc shape with a larger diameter than the device wafer 20 is stuck to the side of the back surface 9 of the substrate 4 of the device wafer 20. In addition, an annular frame 52 with an inner diameter larger than the diameter of the device wafer 20 is mounted on the peripheral edge of the dicing tape 51.

In the embodiment, in the dividing step ST9, a cutting apparatus 80 illustrated in FIG. 15 sucks and holds the side of the back surface 9 of the device wafer 20 over a holding surface of a chuck table that is not illustrated in the diagram with the intermediary of the dicing tape 51. In the dividing step ST9, the cutting apparatus 80 images the front surface 13 of the sealant 3 that seals the front surfaces 7 of the device wafer 20 by imaging means and detects the bumps 8 exposed from the front surface 13 of the sealant 3 as illustrated in FIG. 16 to fulfill alignment in which position adjustment between a cutting blade 82 of a cutting unit 81 and the groove 24 is executed. A second thickness of the cutting blade 82 used in the dividing step ST9 is smaller than the first thickness of the cutting blade 32 used in the groove forming step ST2.

In the dividing step ST9, the cutting apparatus 80 makes the cutting blade 82 cut into the center of the sealant 3 buried in the groove 24 in the width direction until reaching the dicing tape 51 from the side of the front surfaces 5 and 7 of the device wafer 20 as illustrated in FIG. 15 while relatively moving the chuck table and the cutting blade 82 along the groove 24. In the dividing step ST9, the cutting apparatus 80 forms the dividing grooves 27 with the second width 27-2 in the sealant 3 that seals the grooves 24 by the cutting blade 82. In the dividing step ST9, as illustrated in FIG. 17, the dividing grooves 27 are formed in the sealant 3 that seals all grooves 24 and the device wafer 20 is divided into the individual packages 1. Along with this, the manufacturing method of packages ends. In FIG. 7 to FIG. 9, FIG. 11 to FIG. 14, and FIG. 17, only two bumps 8 of the device 6 of each device chip 2 are illustrated and the other bumps 8 are omitted.

In the embodiment, the second thickness of the cutting blade 82 is smaller than the first thickness and therefore the dividing grooves 27 have the second width 27-2 that is equivalent to the second thickness and is smaller than the first width 24-2. In the embodiment, the dividing grooves 27 are formed by cutting processing in which the cutting blade 82 is made to cut into the sealant 3 buried in the groove 24. However, in the present invention, the dividing grooves 27 may be formed by ablation processing in which the sealant 3 is irradiated with a laser beam with such a wavelength as to be absorbed by the sealant 3 along the grooves 24. The packages 1 divided individually are picked up from the dicing tape 51 by a pickup apparatus that is not illustrated in the diagram and are conveyed to the subsequent step.

In the manufacturing method of packages according to the embodiment described above, the grooves 24 that are half-cut grooves are formed in the front surface 5 of the substrate 4 and the side of the front surfaces 5 and 7 is sealed by the sealant 3. Thereafter, only the part corresponding to the device region 22 in the back surface 9 of the substrate 4 of the device wafer 20 is ground and part of the device wafer 20 is thinned to form the recessed part 25 at the center, and the peripheral surplus region 23 is formed into the annular projection part 26 with the thickness before the grinding. Furthermore, in the manufacturing method of packages, the recessed part 25 at the center corresponding to the device region 22 in the back surface 9 of the substrate 4 is filled with the heat-curable resin that forms the sealant 3 and thereafter the device wafer 20 is divided. Thus, in the manufacturing method of packages, the need to remove the annular projection part 26 in order to make the device wafer 20 be held by the chuck table of the cutting apparatus 80 that divides the device wafer 20 into the individual packages 1 does not arise. As a result, the manufacturing method of packages can reduce the possibility of breakage of the device wafer 20. Moreover, in the manufacturing method of packages, the recessed part 25 of the device wafer 20 is sealed by the sealant 3 and the device wafer 20 is divided into the individual packages 1. Therefore, mounting on a substrate and a dividing step of a sealing substrate become unnecessary.

In the manufacturing method of packages, in the front surface planarization step ST4, the tips 11 of the bumps 8 are exposed from the front surface 13 of the sealant 3. Therefore, the package 1 after the dividing can be surely mounted on a substrate or the like.

Furthermore, in the manufacturing method of packages, in the planarization step ST8, the surface 14 of the sealant 3 that seals the inside of the recessed part 25 is planarized. Therefore, the package 1 with high-precision dimensions can be obtained.

Moreover, in the manufacturing method of packages, the front surface 13 of the sealant 3 is planarized by the tool bit 44 of the tool bit cutting apparatus 40 to expose the tips 11 of the bumps 8 in the front surface planarization step ST4. Therefore, burrs formed through extension of the metal that forms the bumps 8 can be suppressed compared with the case of planarizing the front surface 13 of the sealant 3 by grinding abrasive stones or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of packages in each of which a device chip is sealed by a sealant, the manufacturing method of packages comprising:
    a device wafer preparation step of preparing a device wafer having a front surface including a device region in which a device is formed in each of regions marked out by a plurality of planned dividing lines that intersect and a peripheral surplus region that surrounds the device region;
    a groove forming step of forming grooves with a depth that reaches a finished thickness of the device chip along the planned dividing lines from the front surface of the device wafer;
    a front surface sealing step of sealing the front surface of the device wafer by the sealant and filling the grooves with the sealant after executing the groove forming step;
    a back surface grinding step of grinding a back surface of the device wafer corresponding to the device region to form a recessed part with a depth that reaches the grooves and form an annular projection part that surrounds the recessed part and corresponds to the peripheral surplus region after executing the front surface sealing step;

a back surface sealing step of filling the recessed part with the sealant to execute sealing after executing the back surface grinding step; and a dividing step of forming dividing grooves with a smaller width than the grooves along the grooves from the front surface of the device wafer and dividing the device wafer to form a plurality of packages in each of which the device chip is sealed by the sealant after executing the back surface sealing step.

2. The manufacturing method of packages according to claim 1, wherein the device has a protrusion electrode, the front surface is sealed by the sealant in such a manner that the protrusion electrode is covered in the front surface sealing step, and the manufacturing method of packages further includes a front surface planarization step of planarizing the sealant on the front surface of the device wafer and exposing an end part of the protrusion electrode after executing the front surface sealing step and before executing the back surface grinding step.

3. The manufacturing method of packages according to claim 1, further comprising:

a planarization step of planarizing the sealant on the back surface of the device wafer after executing the back surface sealing step and before executing the dividing step.

* * * * *